United States Patent
Ikeda

(10) Patent No.: US 10,653,051 B2
(45) Date of Patent: May 12, 2020

(54) ELECTRONIC COMPONENT MOUNTING DEVICE AND DISPENSER

(71) Applicant: Panasonic Intellectual Property Management Co., Ltd., Osaka (JP)

(72) Inventor: Kouji Ikeda, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 16/084,325

(22) PCT Filed: Apr. 4, 2017

(86) PCT No.: PCT/JP2017/014053
§ 371 (c)(1),
(2) Date: Sep. 12, 2018

(87) PCT Pub. No.: WO2017/179459
PCT Pub. Date: Oct. 19, 2017

(65) Prior Publication Data
US 2019/0075691 A1  Mar. 7, 2019

(30) Foreign Application Priority Data

Apr. 11, 2016 (JP) .................. 2016-078540

(51) Int. Cl.
*H05K 13/04* (2006.01)
*H05K 3/34* (2006.01)
(Continued)

(52) U.S. Cl.
CPC .......... *H05K 13/0469* (2013.01); *B05C 5/00* (2013.01); *H05K 3/305* (2013.01); *H05K 3/34* (2013.01);
(Continued)

(58) Field of Classification Search
CPC ...... B05C 5/00; H05K 13/04; H05K 13/0409; H05K 13/0469; H05K 13/0812; H05K 3/305; H05K 3/34
(Continued)

(56) References Cited

U.S. PATENT DOCUMENTS

| 9,338,892 B2* | 5/2016 | Mantani | ........... B41F 15/16 |
| 2013/0208048 A1* | 8/2013 | Kritchman | ........ B41J 2/16538 347/32 |
| 2014/0055525 A1* | 2/2014 | Kritchman | ........ B41J 2/16538 347/33 |

FOREIGN PATENT DOCUMENTS

| CN | 102343315 A | 2/2012 |
| CN | 104241457 A | 12/2014 |

(Continued)

OTHER PUBLICATIONS

English translation of JP06-198231.*
(Continued)

*Primary Examiner* — Sonya M Sengupta
(74) *Attorney, Agent, or Firm* — Pearne & Gordon LLP

(57) ABSTRACT

According to the present disclosure, an electronic component mounting device includes: a mounting head which picks up an electronic component from a part feeder, and transfers and mounts the electronic component on a board; a dispenser which applies a paste to a lower surface of the electronic component picked up by the mounting head, the paste being flied out from an ejection hole of the dispenser against gravity, the ejection hole opening upwardly; and a shield member which is disposed between the electronic component and the dispenser and has an opening above the ejection hole.

18 Claims, 12 Drawing Sheets

(51) Int. Cl.
*B05C 5/00* (2006.01)
*H05K 3/30* (2006.01)
*H05K 13/08* (2006.01)

(52) U.S. Cl.
CPC ......... *H05K 13/04* (2013.01); *H05K 13/0409* (2018.08); *H05K 13/0812* (2018.08)

(58) Field of Classification Search
USPC ........................................ 156/293, 423, 539
See application file for complete search history.

(56) References Cited

FOREIGN PATENT DOCUMENTS

| | | |
|---|---|---|
| JP | H06-198231 A | 7/1994 |
| JP | 2012-028780 A | 2/2012 |

OTHER PUBLICATIONS

International Search Report of PCT application No. PCT/JP2017/014053 dated Jul. 4, 2017.
English Translation of Chinese Search Report dated Feb. 6, 2020 for the related Chinese Patent Application No. 201780021107.6.

* cited by examiner

ELECTRONIC COMPONENT MOUNTING DEVICE AND DISPENSER

This application is a U.S. national stage application of the PCT International Application No. PCT/JP2017/014053 filed on Apr. 4, 2017, which claims the benefit of foreign priority of Japanese Patent Application No. 2016-078540 filed on Apr. 11, 2016, the contents all of which are incorporated herein by reference.

TECHNICAL FIELD

The present disclosure relates to an electronic component mounting device which picks up an electronic component from a part feeder by a mounting head and transfers and mounts the electronic component on a board, and a dispenser used in the electronic component mounting device.

BACKGROUND ART

Recently, with respect to a large-sized component such as a ball grid array (BGA), it is important to ensure bonding strength including a temporary fixing function after mounting a component for enhancing quality of a product. For this end, as an electronic component mounting device, there has been used an electronic component mounting device which has a function of supplying an adhesive agent to a lower surface of an electronic component in a state where the electronic component is held on a mounting head after being picked up (see PTL 1, for example). A prior art disclosed in this patent literature is directed to an electronic component mounting device (automatic mounting device) for mounting an electronic component (constitutional element) on a board. The electronic component mounting device is configured such that an adhesive agent is additionally coated to a lower surface of the electronic component held by a mounting head (loading head) by a dispenser system having a function of ejecting an adhesive agent (dispenser medium) against gravity.

CITATION LIST

Patent Literature

PTL 1: Unexamined Japanese Patent Publication No. 2012-028780

SUMMARY OF THE INVENTION

According to one aspect of the present disclosure, there is provided an electronic component mounting device which includes: a mounting head which picks up an electronic component from a part feeder, and transfers and mounts the electronic component on a board; a dispenser which applies a paste to a lower surface of the electronic component picked up by the mounting head, the paste being flied out from an ejection hole against gravity, the ejection hole opening upwardly; and a shield member which is disposed between the electronic component and the dispenser and has an opening above the ejection hole.

According to another aspect of the present disclosure, there is provided an electronic component mounting device which includes: a mounting head which picks up an electronic component from a part feeder, and transfers and mounts the electronic component on a board; a feeder base which has a slot in which the part feeder is mounted; the part feeder which is mounted in the slot of the feeder base; and a dispenser which applies a paste to a lower surface of the electronic component picked up by the mounting head, the paste being flied out from an ejection hole of the dispenser against gravity, the ejection hole opening upwardly. The dispenser has a shield member where a portion of the shield member which corresponds to the ejection hole is opened in a limited manner at a position upwardly away from the ejection hole.

According to one aspect of the present disclosure, there is provided a dispenser which is mounted on an electronic component mounting device where a mounting head picks up an electronic component from a part feeder mounted in a slot of a feeder base, and transfers and mounts the electronic component on a board, wherein the dispenser includes: a body portion which is mountable in the slot; an ejection hole which caused a paste to fly upward toward a lower surface of the electronic component picked up by the mounting head; and a shield member which has a portion opening above the ejection hole at a position upwardly away from the ejection hole.

DESCRIPTION OF EMBODIMENT

Problems of conventional devices will briefly be described prior to description of an exemplary embodiment of the present disclosure.

In the previously mentioned coating of an adhesive agent, it is necessary to accurately coat the adhesive agent at a predetermined position of an electronic component which becomes an object to be coated. However, when the ejection hole or the surrounding of the ejection hole of the dispenser system is smeared by the adhesive agent, a flying direction of the adhesive agent or a shape of a liquid droplet is disturbed thus giving rise to a drawback that the adhesive agent is adhered to a position where the adhesion of the adhesive agent is not desirable. For example, when an insulating adhesive agent adheres to an electrode of an electronic component, a conduction failure which obstructs the conduction between the electrode of the electronic component and an electrode of a board occurs thus giving rise to a drawback that quality of a product is deteriorated. There may be also a case where an adhesive agent adheres to a mounting head of the electronic component mounting device. If such a state is left as it is, a defect may occur in the electronic component mounting device. Accordingly, there exists a drawback that it is necessary to add an operation to remove the adhesive agent by a cleaning operation thus increasing a burden imposed on an operator.

Exemplary Embodiment

Next, an exemplary embodiment of the present disclosure is described with reference to the drawings. First, a configuration of electronic component mounting device 1 for mounting an electronic component on a board is described with reference to FIG. 1 and FIG. 2. Electronic component mounting device 1 has a function of taking out an electronic component from a part feeder which supplies the electronic component and transferring and mounting the electronic component on the board. FIG. 2 partially shows a cross section taken along line A-A in FIG. 1.

Figure 1:
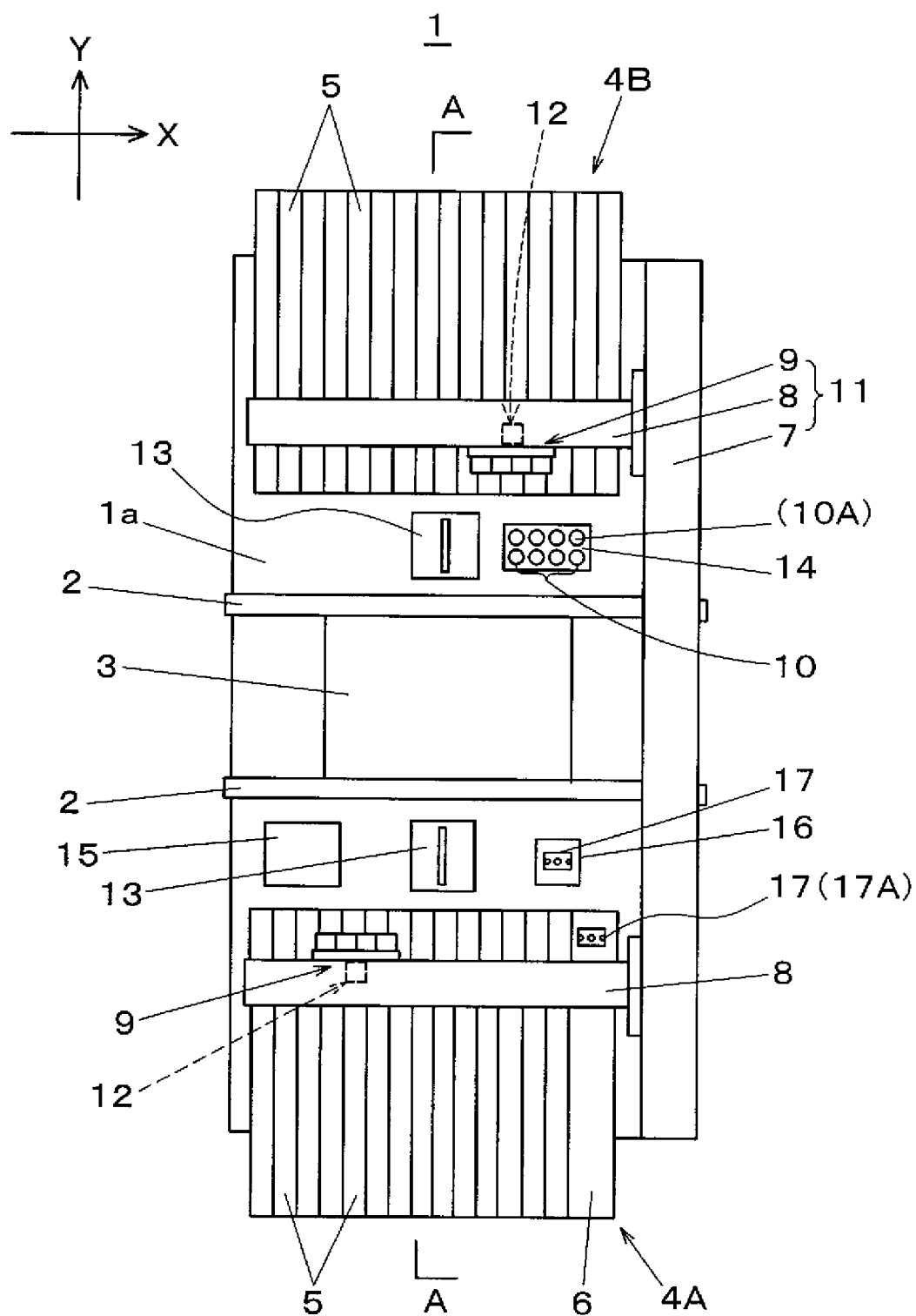
FIG. 1 is a plan view of an electronic component mounting device according to an exemplary embodiment of the present disclosure.
Figure 2:
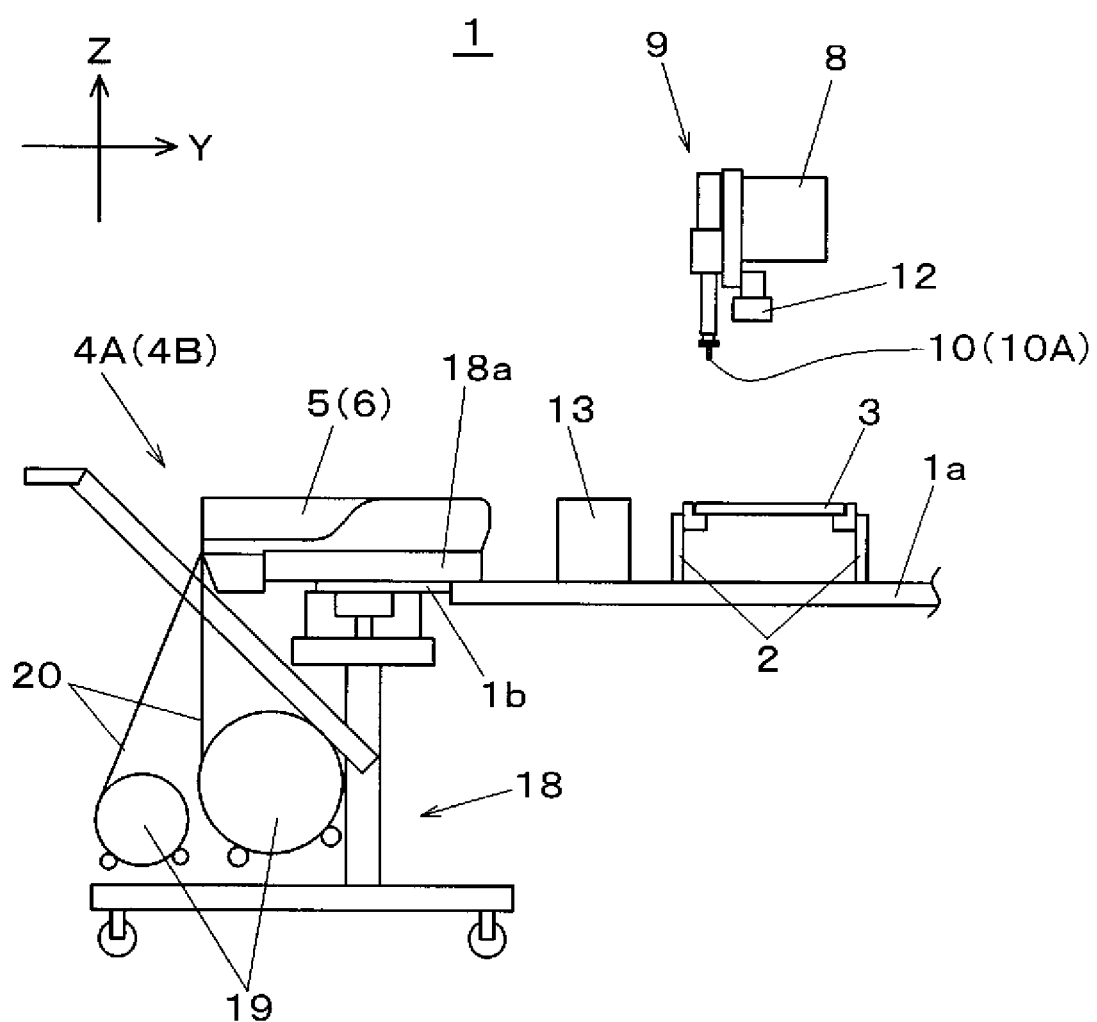
FIG. 2 is a partial cross-sectional view of the electronic component mounting device according to the exemplary embodiment of the present disclosure.

In FIG. 1, board transport mechanism 2 is disposed on the center of base 1a in an X direction (board transport direction). Board transport mechanism 2 transports board 3 carried in from an upstream side, and positions and holds board 3 on a mounting stage set for performing a component mounting operation. Component supply parts 4A, 4B are disposed on both sides of board transport mechanism 2, and feeder base 18a having a plurality of slots in which part feeders are mounted (see FIG. 2) is disposed at each of component supply parts 4A, 4B. Tape feeders 5 which form at least one part feeder are mounted in the slots of feeder base 18a parallel to each other.

In this exemplary embodiment, at one component supply part 4A (on a lower side in FIG. 1), tape feeders 5 and dispenser 6 for supplying electronic components to electronic component mounting device 1 are mounted in the slots of feeder base 18a used in common. Tape feeder 5 feeds a carrier tape which accommodates electronic components in a tape feeding direction by pitch feeding so that the electronic components are supplied to a pick-up position where the electronic component is picked up by a mounting head of the component mounting mechanism described hereinafter.

Figure 8A:
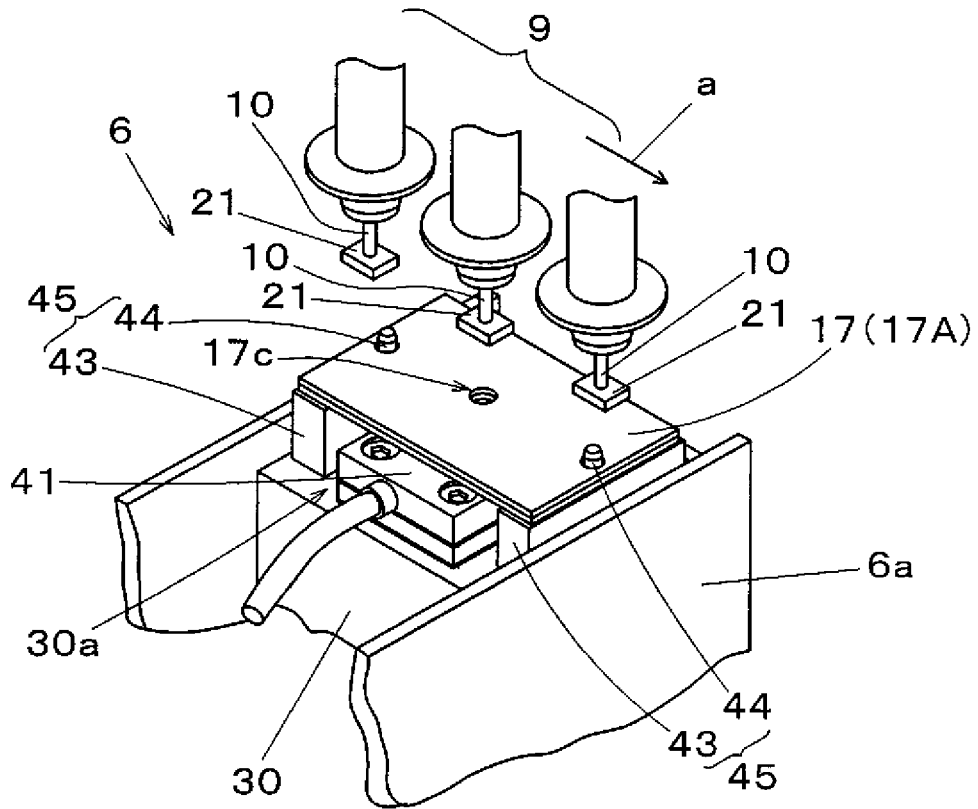
FIG. 8A is an operation explanatory view when the temporary use member is used as the shield member in the electronic component mounting device according to the exemplary embodiment of the present disclosure.
Figure 8B:
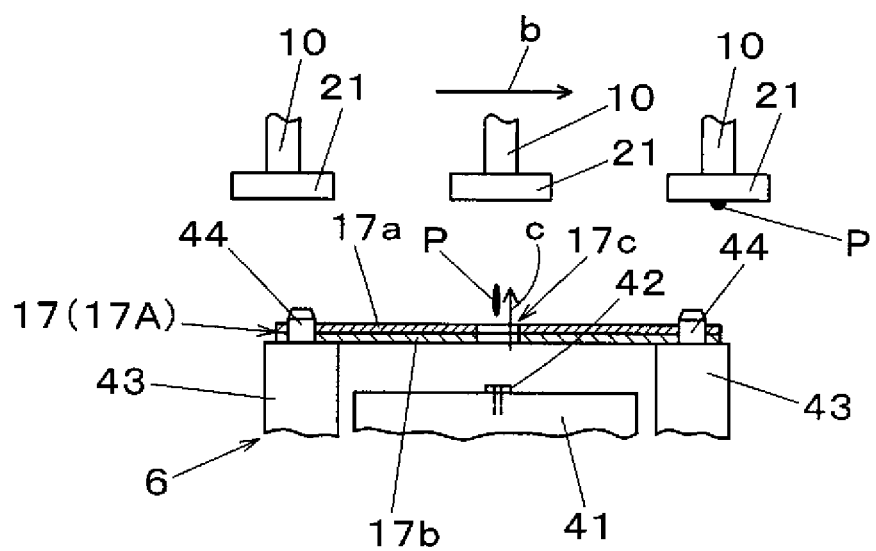
FIG. 8B is an operation explanatory view when the temporary use member is used as the shield member in the electronic component mounting device according to the exemplary embodiment of the present disclosure.

Dispenser 6 has a function of coating paste P such as an adhesive agent for bonding a component which is caused to fly out from upwardly opening ejection hole 42 against gravity to a lower surface of electronic component 21 picked up by the mounting head from a lower surface side (see FIGS. 8A, 8B). In this exemplary embodiment, an example where dispenser 6 is disposed only on component supply part 4A on one side is exemplified. However, component supply part 4B on the other side may have substantially the same configuration.

Y-axis movable table 7 having a linear driving mechanism is disposed, in a Y direction (a direction orthogonal to an X direction), on an end portion of an upper surface of base 1a on one side in the X direction. Two X-axis movable tables 8 each of which has a linear driving mechanism in the same manner are joined to Y-axis movable table 7 in a movable manner in the Y direction. Mounting head 9 is mounted on each of two X-axis movable tables 8 in a movable manner in the X direction.

Mounting head 9 is a multiple-type head having a plurality of holding heads, and as shown in FIG. 2, component suction nozzle 10 which sucks and holds a component and is individually elevatable is mounted on a lower end portion of each holding head. Mounting head 9 includes a Z-axis elevating and lowering mechanism which elevates or lowers component suction nozzle 10, and a θ-axis rotating mechanism which rotates component suction nozzle 10 about a nozzle axis.

Mounting head 9 moves in the X direction and in the Y direction by driving Y-axis movable table 7 and X-axis movable tables 8. With such an operation, two mounting heads 9 respectively pick up electronic components by component suction nozzles 10 from pick up positions of table feeders 5 of component supply parts 4A, 4B corresponding to mounting heads 9. In this exemplary embodiment, mounting head 9 has a function of holding temporary use member 17 described hereinafter for performing predetermined operational processing such as the transfer besides electronic component 21 supplied by tape feeders 5.

Component recognition camera 13, disposal box 15, and temporary use member supply part 16 are disposed between component supply part 4A on a lower side and board transport mechanism 2, and part recognition camera 13 and nozzle holder 14 are disposed between component supply part 4B on an upper side and board transport mechanism 2. Temporary use member supply part 16 has a function of stacking a plurality of plate-like or sheet-like temporary use members 17 and supplying temporary use members 17.

In this exemplary embodiment, temporary use member 17 is a member temporarily used in a process of operating dispenser 6. Electronic component mounting device 1 according to this exemplary embodiment includes a dispenser processing operation part which performs predetermined processing on dispenser 6 using temporary use member 17 supplied from temporary use member supply part 16, and the dispenser processing operation part performs processing described hereinafter.

First, temporary use member 17 is disposed above dispenser 6 such that opening portion 17c (see FIG. 4A, FIG. 4B) is positioned above ejection hole 42 (see FIG. 5) of dispenser 6. Temporary use member 17 is used for reducing scattering of paste P being caused to fly out by dispenser 6. That is, in this application, temporary use member 17 is disposed between electronic component 21 and dispenser 6, and is used as shield member 17A where a portion disposed above ejection hole 42 is opened by opening portion 17c (see FIG. 8A, FIG. 8B).

In this case, the dispenser processing operation part performs an operation of changing temporary use member 17 used as shield member 17A. That is, the dispenser processing operation part performs an operation of taking out unused temporary use member 17 from temporary use member supply part 16, making dispenser 6 hold temporary use member 17 as shield member 17A, and discarding and recovering used shield member 17A in disposal box 15.

Next, temporary use member 17 is used in an application as measurement member 17B which receives paste P which is caused to fly out experimentally from dispenser 6. In this case, the dispenser processing operation part performs an operation where paste P which is caused to fly out experimentally from dispenser 6 for the purpose of trial coating is received by temporary use member 17 which functions as measurement member 17B (see FIG. 9A, FIG. 9B). In such an operation, an operation of holding measurement member 17B by mounting head 9 and moving measurement member 17B above dispenser 6 is performed.

Further, temporary use member 17 is used in an application as cleaning member 17C which wipes off paste P adhering to ejection hole 42 or the surrounding of ejection hole 42 of dispenser 6. In this case, the dispenser processing operation part performs an operation of wiping off paste P adhering to ejection hole 42 (see FIG. 5) or the surrounding of ejection hole 42 of dispenser 6 by temporary use member 17 which functions as cleaning member 17C. In this operation, a wiping operation is performed where cleaning member 17C is held by mounting head 9, is positioned above dispenser 6, and is made to slide with respect to ejection hole 42.

In the above-mentioned predetermined processing performed using dispenser 6 as an object, a temporary use member holding part which holds temporary use member 17 is provided to mounting head 9, and mounting head 9 having such a configuration functions as the dispenser processing operation part. As a specific example of the temporary use member holding part, in this exemplary embodiment, member holding nozzle 10A which is mounted on mounting head 9 exchangeably with component suction nozzle 10, and capable of sucking and holding temporary use member 17 is used. One specified holding head among the holding heads which mounting head 9 formed of a multiple-type head has may be used as the temporary use member holding part dedicated for holding temporary use member 17.

As described above, in this exemplary embodiment, temporary use member 17 is used in three applications described hereinafter. That is, temporary use member 17 is used in the application as shield member 17A where temporary use member 17 is disposed above dispenser 6 and between electronic component 21 and dispenser 6, and a portion of shield member 17A is opened only above ejection hole 42 of dispenser 6 so that shield member 17A is used for the purpose of reducing scattering of paste P which is caused to fly out by dispenser 6. Temporary use member 17 is also used in the application as measurement member 17B which receives paste P being caused to fly out experimentally from dispenser 6. Temporary use member 17 is further used in the application as cleaning member 17C which wipes off paste P adhering to ejection hole 42 or the surrounding of ejection hole 42 of dispenser 6. In this exemplary embodiment, temporary use member 17 is used in at least two applications among these three applications.

Nozzle holder 14 stores a plurality of suction nozzles mounted on mounting head 9. In these suction nozzles, besides component suction nozzle 10 mounted for the purpose of suctioning and holding electronic component 21, member holding nozzle 10A for suctioning and holding temporary use member 17 is included. By allowing mounting head 9 to get access to nozzle holder 14 and to perform a predetermined nozzle exchanging operation, component suction nozzle 10 or member holding nozzle 10A is mounted on mounting head 9 in response to an object to be held.

Disposal box 15 recovers electronic component 21 which is determined defective as a result of recognition of a result of imaging obtained by component recognition camera 13, and used temporary use member 17. That is, with a disposal operation performed by moving mounting head 9 which holds electronic component 21 or temporary use member 17 forming an object to be recovered to disposal box 15, the object to be recovered is discarded and recovered in disposal box 15. Accordingly, disposal box 15 functions as a recovery part for recovering used temporary use member 17 by mounting head 9.

When mounting head 9 which picks up electronic component 21 from component supply part 4A, 4B moves above component recognition camera 13, component recognition camera 13 images electronic component 21 in a state where electronic component 21 is held by mounting head 9. By applying recognition processing to a result of this imaging by image recognition 52a of mounting processing part 52 (see FIG. 11), the identification and the position detection of electronic component 21 are performed. On the other hand, mounting head 9 which holds measurement member 17B after trial coating is moved to the position above component recognition camera 13, and measurement member 17B is imaged. By applying recognition processing to a result of imaging using a recognition processing function which coating amount measurement 53c of dispenser maintenance processing part 53 has, a coating amount and a coating position of paste P coated to measurement member 17B by trial coating can be measured. Accordingly, component recognition camera 13 and coating amount measurement 53c form a measurement part which measures paste P coated to temporary use member 17 which forms measurement member 17B.

Board recognition camera 12 is mounted on each of mounting heads 9. Each board recognition camera 12 is positioned on a lower surface side of X-axis movable table 8, and integrally moves with mounting head 9. When mounting head 9 moves, board recognition camera 12 moves to a position above board 3 which is positioned by board transport mechanism 2 and images board 3. By applying recognition processing to a result of this imaging by image recognition 52a of mounting processing part 52 in the same manner (see FIG. 11), the position detection of board 3 is performed.

As shown in FIG. 2, feeder base 18a having a plurality of slots (not shown in the drawing) in which part feeders are mounted is provided to each of component supply part 4A, 4B. Carriage 18 in a state where a plurality of tape feeders 5 which are part feeders are detachably mounted in slots of feeder base 18a in advance is provided to each of component supply part 4A, 4B. In each of component supply parts 4A, 4B, the position of carriage 18 is fixed to fixed base 1b provided on base 1a by clamping feeder base 18a. Supply reels 19, which store carrier tapes 20 holding electronic components 21 in a wound state, are held in carriage 18. Carrier tapes 20 unwound from supply reels 19 are fed by tape feeders 5 with pitch feeding to component pick-up positions for component suction nozzle 10.

Figure 3:
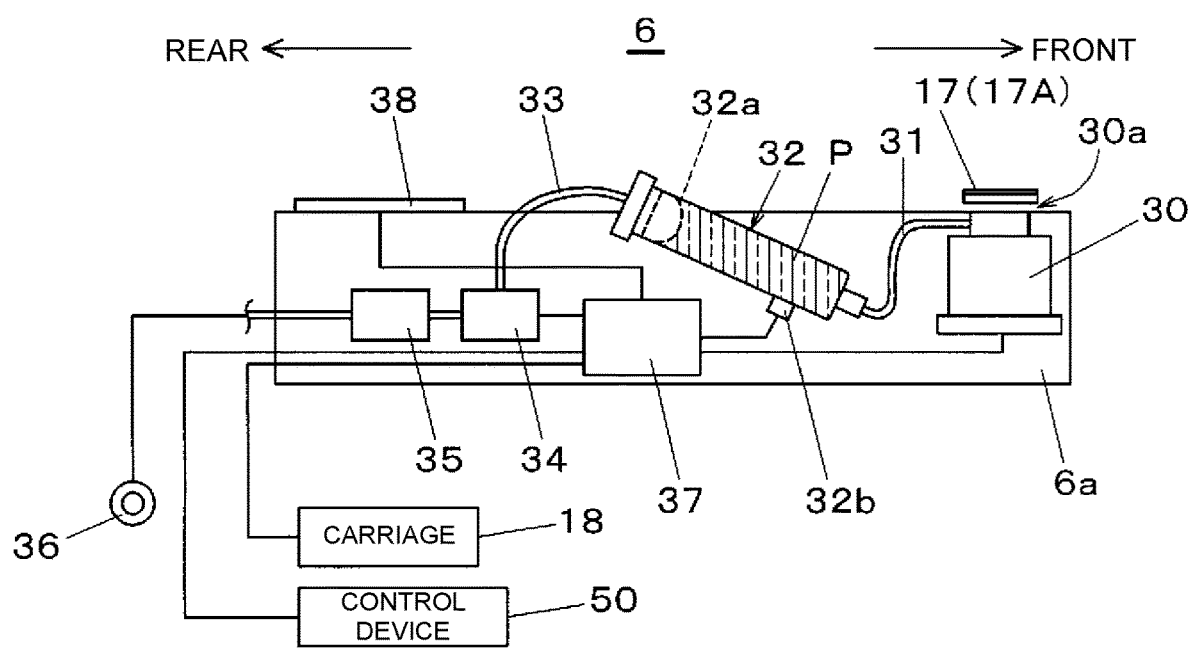
FIG. 3 is a constitutional explanatory view of a dispenser mounted on the electronic component mounting device according to the exemplary embodiment of the present disclosure.

Next, a configuration and a function of dispenser 6 used in electronic component mounting device 1 having the above-mentioned configuration are described with reference to FIG. 3. In FIG. 3, body portion 6a which forms a body of dispenser 6 has mounting exchangeability with tape feeder 5, and is detachably mountable in a slot which feeder base 18a mounted on carriage 18 has. In the present disclosure, detachable mounting of dispenser 6 on feeder base 18a is not an indispensable condition. Dispenser 6 may be disposed separately and independently from tape feeder 5 outside a range of feeder base 18a.

Ejection mechanism 30 which ejects a paste with which a coating object is coated is disposed on a front end portion of body portion 6a in a state where ejection head part 30a provided with ejection nozzle 41 having ejection hole 42 (see FIG. 5) is directed toward an upper surface side. Paste P is ejected from ejection hole 42 of ejection head part 30a such that paste P flies out upward toward a lower surface of electronic component 21 picked up by mounting head 9 (see FIG. 8A, FIG. 8B).

At a position disposed upwardly away from ejection hole 42, temporary use member 17 having a portion which opens above ejection hole 42 (see opening portion 17c in FIG. 5) is mounted as shield member 17A. In coating paste P by dispenser 6 to a lower surface of electronic component 21 picked up by mounting head 9, shield member 17A having the portion which opens above ejection hole 42 is disposed between electronic component 21 and dispenser 6.

Behind ejection mechanism 30, syringe 32 which ejects stored paste P by air pressure is disposed in an oblique posture. Ejection pipe 31 and pressurizing pipe 33 are connected to an ejection side and a pressurizing side of syringe 32, respectively. Float member 32a for pressurizing stored paste P is inserted into syringe 32, and a residual amount detection sensor 32b for detecting that paste P is decreased to a predetermined level is mounted on an outer peripheral surface of syringe 32.

Ejection pipe 31 is connected to ejection nozzle 41 of ejection head part 30a, and pressurizing pipe 33 is connected to valve unit 34. Valve unit 34 is further connected to air supply source 36 by way of regulator 35. Air supplied from air supply source 36 is regulated to predetermined air pressure by regulator 35. By turning on or off valve unit 34, the air is supplied to syringe 32 by way of pressurizing pipe 33 for a predetermined valve open time. In such an operation, the air pressure and the valve open time are used as regulation parameters for regulating an ejection amount of paste Pin a single shot by ejection mechanism 30.

Dispenser 6 has controller 37 for controlling a paste ejecting operation. Controller 37 is connected to ejection mechanism 30, residual amount detection sensor 32b, operation panel 38, carriage 18, and control device 50. Controller 37 executes control in response to a control command from the control device 50 and the supply of power from carriage 18 so that controller 37 controls an operation of coating paste P by ejection mechanism 30. In a process where paste P is consumed along with such a coating operation, controller 37 detects the decrease of paste P in syringe 32 based on a detection result of residual amount detection sensor 32b. Further, controller 37 can perform a predetermined control operation in response to a manual operation command input by way of operation panel 38.

Figure 4A:
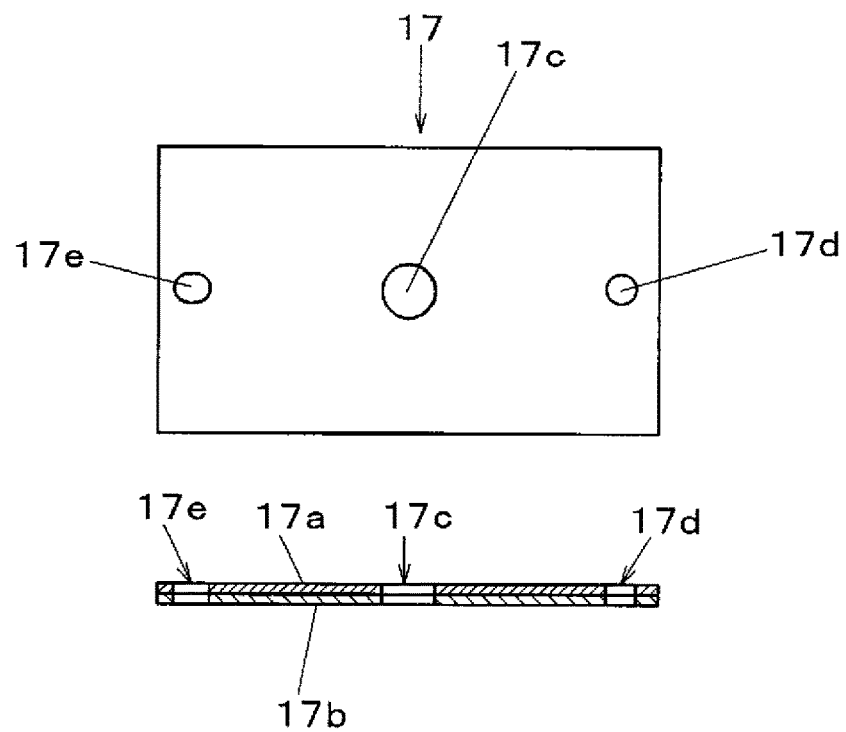
FIG. 4A is a constitutional explanatory view of a temporary use member and a temporary use member supply part adopted by the electronic component mounting device according to the exemplary embodiment of the present disclosure.

Next, temporary use member 17 and temporary use member supply part 16 which supplies temporary use member 17 are described with reference to FIG. 4A and FIG. 4B. As shown in FIG. 4A, temporary use member 17 is a rectangular plate-like member. Temporary use member 17 has at least two layers. That is, temporary use member 17 has: first layer 17a which is a layer on an upper surface side, that is, on a side where temporary use member 17 is held by component suction nozzle 10 of mounting head 9; and second layer 17b which is a layer on a lower surface side, that is, on a side where temporary use member 17 is used in a predetermined processing operation while facing dispenser 6 in a state where temporary use member 17 is mounted on dispenser 6.

To facilitate stable holding by suction of temporary use member 17 by member holding nozzle 10A, first layer 17a is formed of a plate-like member molded using a resin material having rigidity or the like and having a flat smooth upper surface. To enable the use of temporary use member 17 in trial coating or wiping of paste P, second layer 17b is formed of a sheet-like member molded by a material such as non-woven fabric or paper which allows easy adhesion or impregnation of paste P to or into second layer 17b.

Temporary use member 17 has: opening portion 17c which is positioned above ejection hole 42 in a state where temporary use member 17 is held by dispenser 6 as shield member 17A; and a pair of positioning hole 17d and positioning hole 17e formed for positioning opening portion 17c with respect to dispenser 6. With respect to the pair of positioning holes 17d and 17e, positioning hole 17d is a reference hole into which a reference pin out of two positioning pins 44 which form shield member mounting part 45 is fitted with a size tolerance of predetermined accuracy, and positioning hole 17e is a follower hole having an elongated hole shape formed by taking into account a positional error between two positioning pins 44.

Figure 4B:
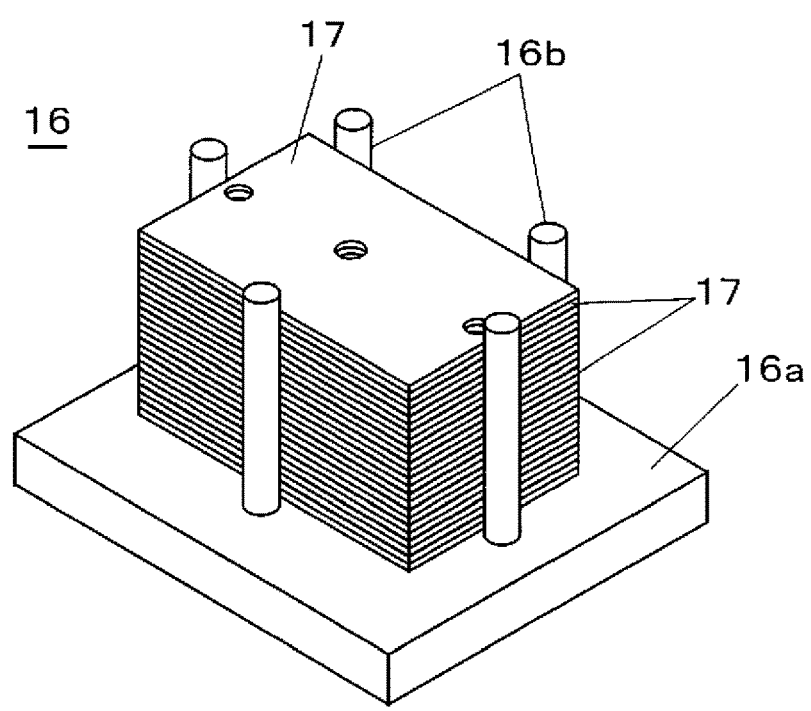
FIG. 4B is a constitutional explanatory view of the temporary use member and the temporary use member supply part adopted by the electronic component mounting device according to the exemplary embodiment of the present disclosure.

FIG. 4B shows the configuration of temporary use member supply part 16 which supplies above-mentioned temporary use member 17. Temporary use member supply part 16 is configured such that position holding posts 16b are mounted upright on an upper surface of flat plate-like pedestal 16a at a plurality of positions following an outer profile of temporary use member 17. A space surrounded by these position holding posts 16b forms a storing space which stores temporary use members 17 in a stacked state while restricting side surfaces of temporary use members 17 by position holding posts 16b. That is, temporary use member supply part 16 supplies plate-like temporary use member 17 which is an object to be supplied in a state where the plurality of temporary use members 17 are stacked. By storing the plurality of temporary use members 17 in a stacked manner, it is possible to supply a necessary number of temporary use members 17 corresponding to an operation for a long time with high storing efficiency, thereby realizing space saving.

Next, the description is made with respect to mounting of temporary use member 17 on dispenser 6 when temporary use member 17 is used as shield member 17A and a function of temporary use member 17 as shield member 17A with reference to FIG. 5 to FIG. 8B. In electronic component mounting device 1 provided with dispenser 6 having the previously mentioned configuration, shield member 17A is used in a state that shield member 17A is disposed between electronic component 21 held by mounting head 9 and dispenser 6.

Figure 5:
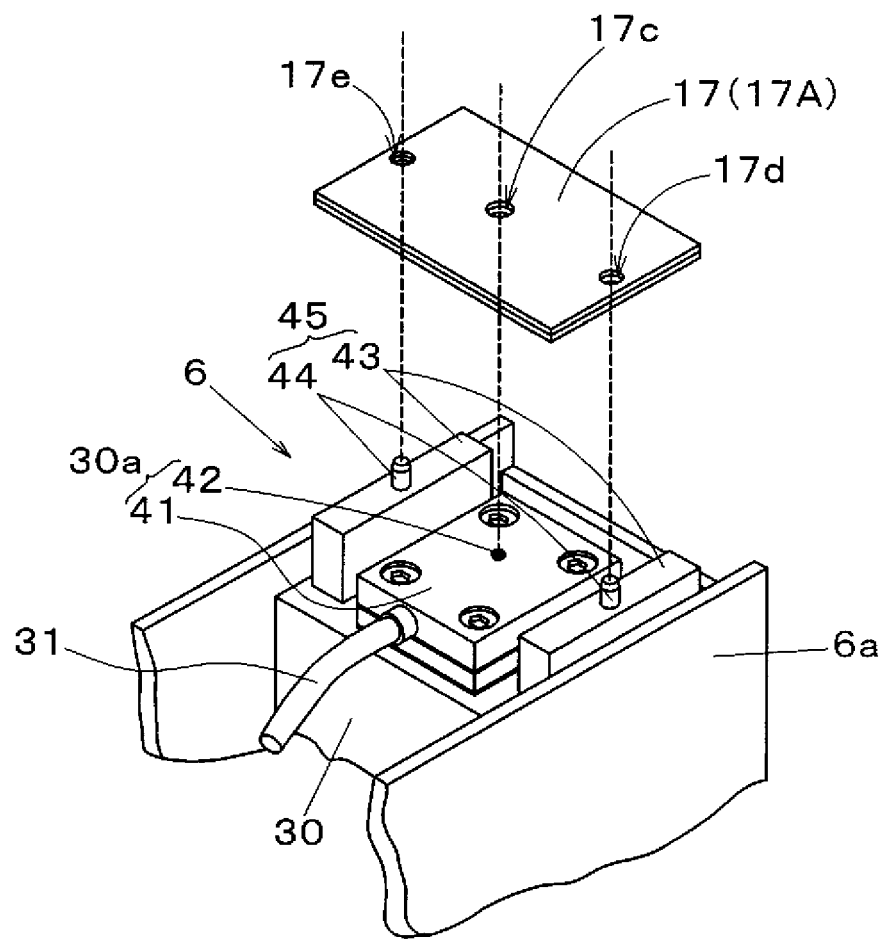
FIG. 5 is a constitutional explanatory view of a temporary use member (shield member) mounting part of the electronic component mounting device according to the exemplary embodiment of the present disclosure.

In FIG. 5, ejection mechanism 30 which forms a portion of dispenser 6 is disposed on a distal end portion of body portion 6a of dispenser 6. Ejection head part 30a disposed on an upper surface of ejection mechanism 30 is configured to mount ejection nozzle 41 having ejection hole 42. Holding blocks 43 each of which has an upper surface on which positioning pin 44 is mounted upright is disposed on both sides of ejection head part 30a, respectively. The pair of holding blocks 43 and the pair of positioning pins 44 form shield member mounting part 45 which holds shield member 17A. By positioning shield member 17A above ejection head part 30a and by aligning positioning holes 17d, 17e with positioning pins 44, opening portion 17c of shield member 17A is positioned just above ejection hole 42 formed in ejection nozzle 41.

Figure 7:
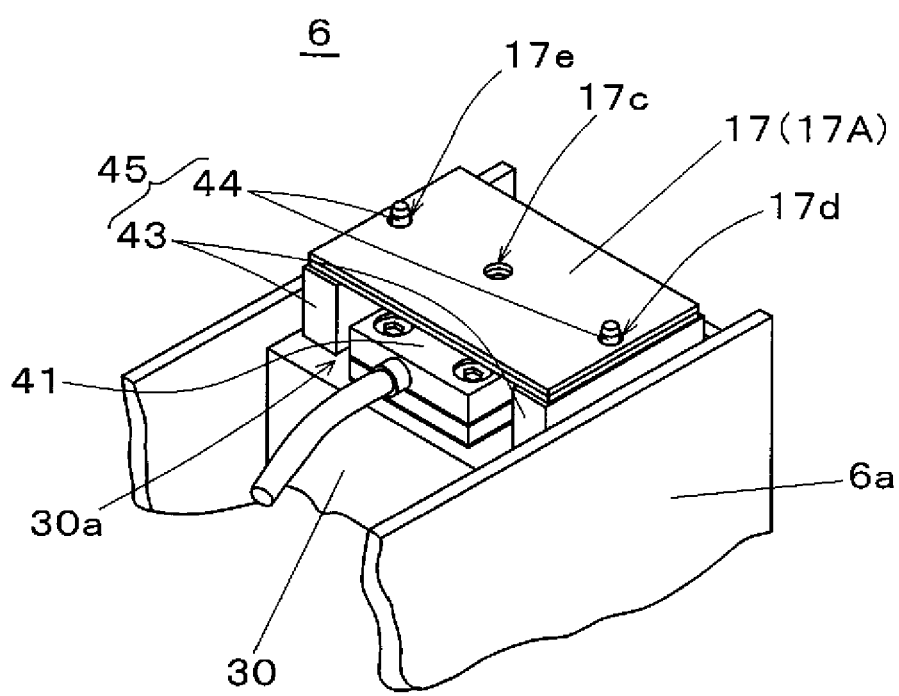
FIG. 7 is an explanatory view of a mounting state of the temporary use member (shield member) of the electronic component mounting device according to the exemplary embodiment of the present disclosure.

By lowering shield member 17A and fitting positioning pins 44 into positioning hole 17d, positioning hole 17e in this state, as shown in FIG. 7, a state is brought about where shield member 17A is held by shield member mounting part 45 which is mounted on dispenser 6. In this state, shield member mounting part 45 holds shield member 17A at a position upwardly away from ejection hole 42 of ejection nozzle 41.

That is, in electronic component mounting device 1, dispenser 6 mounted in the slot of feeder base 18a (see FIG. 2) is configured to have shield member 17A where a portion of shield member 17A which corresponds to ejection hole 42 opens in a limited manner at a position upwardly away from ejection hole 42. With such a configuration, shield member 17A and ejection hole 42 can be disposed in a spaced apart manner from each other and hence, it is possible to prevent ejection hole 42 and a periphery of ejection hole 42 from being smeared by paste P adhering to shield member 17A.

Figure 6:
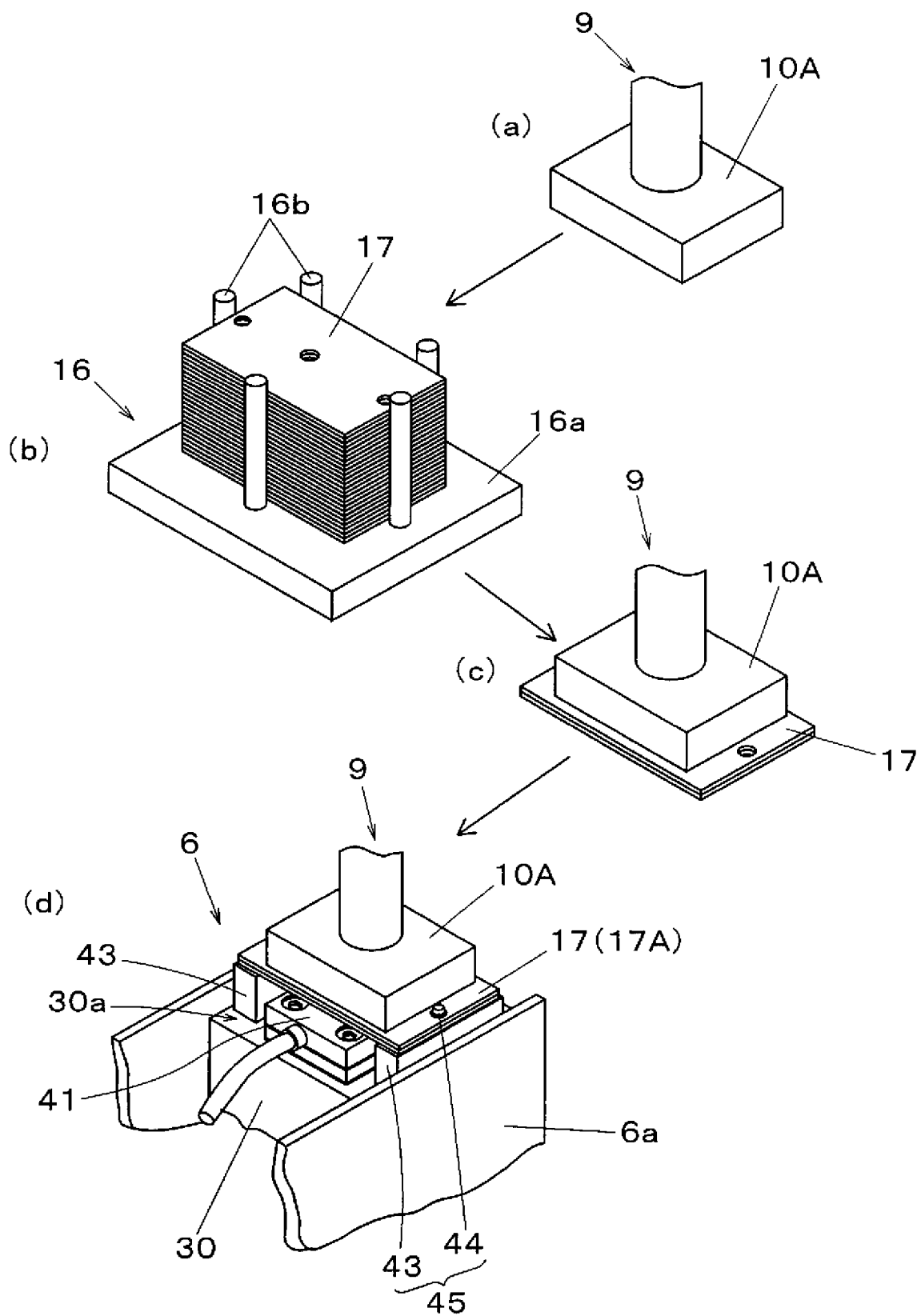
FIG. 6 is an operation explanatory view of a temporary use member (shield member) mounting operation in the electronic component mounting device according to the exemplary embodiment of the present disclosure.

Mounting of shield member 17A on dispenser 6 is performed in accordance with operation steps shown in FIG. 6. First, as shown in part (a) of FIG. 6, member holding nozzle 10A dedicatedly prepared for holding temporary use member 17 is mounted on mounting head 9. That is, mounting head 9 is moved to nozzle holder 14, and mounting head 9 is lowered toward member holding nozzle 10A, and a nozzle exchanging operation is performed.

Next, mounting head 9 is moved to temporary use member supply part 16 shown in part (b) of FIG. 6, member holding nozzle 10A is lowered to temporary use members 17 stored in temporary use member supply part 16 in a stacked state, and a suction operation is performed. With such steps, as shown in part (c) of FIG. 6, temporary use member 17 is held by suction by member holding nozzle 10A mounted on mounting head 9.

Then, mounting head 9 which holds temporary use member 17 by member holding nozzle 10A is moved to a position above dispenser 6. Next, as shown in part (d) of FIG. 6, member holding nozzle 10A is lowered toward dispenser 6, and positioning pins 44 are inserted into positioning hole 17d, positioning hole 17e of shield member 17A thus enabling shield member mounting part 45 of dispenser 6 to hold temporary use member 17 as shield member 17A. That is, as shown in FIG. 7, positioning pins 44 of shield member mounting part 45 are fitted in positioning hole 17d, positioning hole 17e of shield member 17A. With such steps, opening portion 17c of shield member 17A is positioned above ejection hole 42 formed in ejection nozzle 41.

In this manner, dispenser 6 includes shield member mounting part 45 for holding temporary use member 17 which forms shield member 17A, and shield member 17A is detachably mounted on shield member mounting part 45. Accordingly, shield member 17A smeared in use can be separated from ejection hole 42 and hence, it is possible to prevent ejection hole 42 and a periphery of ejection hole 42 from being smeared by paste P adhering to shield member 17A after use. In the above-mentioned configuration, mounting head 9 which is movable in a state where member holding nozzle 10A is mounted on mounting head 9 and temporary use member 17 is held by suction forms a shield member exchanging part where shield member 17A to which paste P adheres is removed from shield member mounting part 45, and unused shield member 17A is picked up from temporary use member supply part 16 and is mounted on shield member mounting part 45. Accordingly, an automatic exchange of shield member 17A smeared in use becomes possible thus realizing the reduction of an operation burden.

In performing the above-mentioned exchange of shield member 17A, the following shield member exchanging operation is performed. That is, used shield member 17A is removed from shield member mounting part 45 of dispenser 6 by mounting head 9 and is transferred to disposal box 15 by mounting head 9, and shield member 17A is discarded into disposal box 15 so that shield member 17A is recovered. Next, unused shield member 17A is picked up from temporary use member supply part 16 by mounting head 9, and shield member 17A is held by shield member mounting part 45 of dispenser 6.

That is, the above-mentioned shield member exchanging part includes: disposal box 15 in which shield member 17A removed from shield member mounting part 45 of dispenser 6 is recovered; the shield member supply part (temporary use member supply part 16) which supplies unused shield member 17A; and mounting head 9 which forms a shield member transferring part for transferring shield member 17A. Mounting head 9 which forms the shield member transferring part is configured to include the shield member holding part having a function of holding shield member 17A on mounting head 9.

The shield member holding part may be configured such that component suction nozzle 10 which holds electronic component 21 and member holding nozzle 10A which is capable of holding shield member 17A by suction are exchanged with each other. By performing a shield member exchange with such a configuration, it is possible to achieve an automatic exchange of shield member 17A with simple and inexpensive configuration by making use of the existing mechanism which electronic component mounting device 1 includes.

Next, a function of shield member 17A held by dispenser 6 is described with reference to FIG. 8A and FIG. 8B. FIG. 8A and FIG. 8B show a paste coating operation performed in operation steps of electronic component mounting device 1 where electronic component 21 is picked up from tape feeder 5 by mounting head 9 and is transferred to and mounted on a board. In the paste coating operation, paste P for bonding a component is coated to a lower surface of electronic component 21 picked up by mounting head 9 using dispenser 6. This paste coating is performed in accordance with paste coating 51b among control processing functions which mounting processing part 52 of control part 50 (see FIG. 11) possesses.

In this exemplary embodiment, paste coating is performed by dispenser 6 in a state where temporary use member 17 which forms shield member 17A is held above ejection head part 30a of dispenser 6 by shield member mounting part 45. That is, as shown in FIG. 8A, mounting head 9 where electronic component 21 is held by suction to each of the plurality of component suction nozzles 10 is moved to a position above shield member 17A held by dispenser 6, and mounting head 9 is moved (arrow a) such that electronic components 21 sequentially pass just above opening portion 17c, that is, just above ejection hole 42 which ejects paste P in dispenser 6.

As shown in FIG. 8B, during the movement of mounting head 9, paste P flies upward through opening portion 17c from upwardly opening ejection hole 42 against gravity (arrow c), and paste P is coated to a lower surface of electronic component 21 moving above ejection hole 42 in a direction indicated by arrow b. In this operation of coating paste P, it is not always a case that paste P ejected from ejection hole 42 of dispenser 6 flies to a desired target position in a desired liquid droplet shape. For example, when ejection hole 42 is smeared due to adhesion of paste P or the like, there may be a case where paste P flies away from a just above direction which is an original target position.

Even in such a case, since shield member 17A is disposed above ejection head part 30a of dispenser 6, with respect to paste P which is ejected from ejection hole 42 and flies, only paste P which flies through opening portion 17c opening in the just above direction which is the target direction is coated to electronic component 21. Accordingly, it is possible to effectively prevent drawbacks attributed to flying of paste P which occur when shield member 17A is not disposed, such as a conduction failure caused by coating of flying paste P at a position away from a portion of electronic component 21 to be coated originally, and an operation failure due to adhesion of paste P to a portion where adhesion of paste P is not desirable such as mechanism portions of mounting head 9 and the like.

In this exemplary embodiment, shield member mounting part 45 is mounted on the upper surface of ejection head part 30a. However, positioning pins 44 which form shield member mounting part 45 may be integrally formed with ejection nozzle 41. With such a configuration, alignment of opening portion 17c of shield member 17A mounted on shield member mounting part 45 and ejection hole 42 can be achieved with higher accuracy.

Figure 9A:
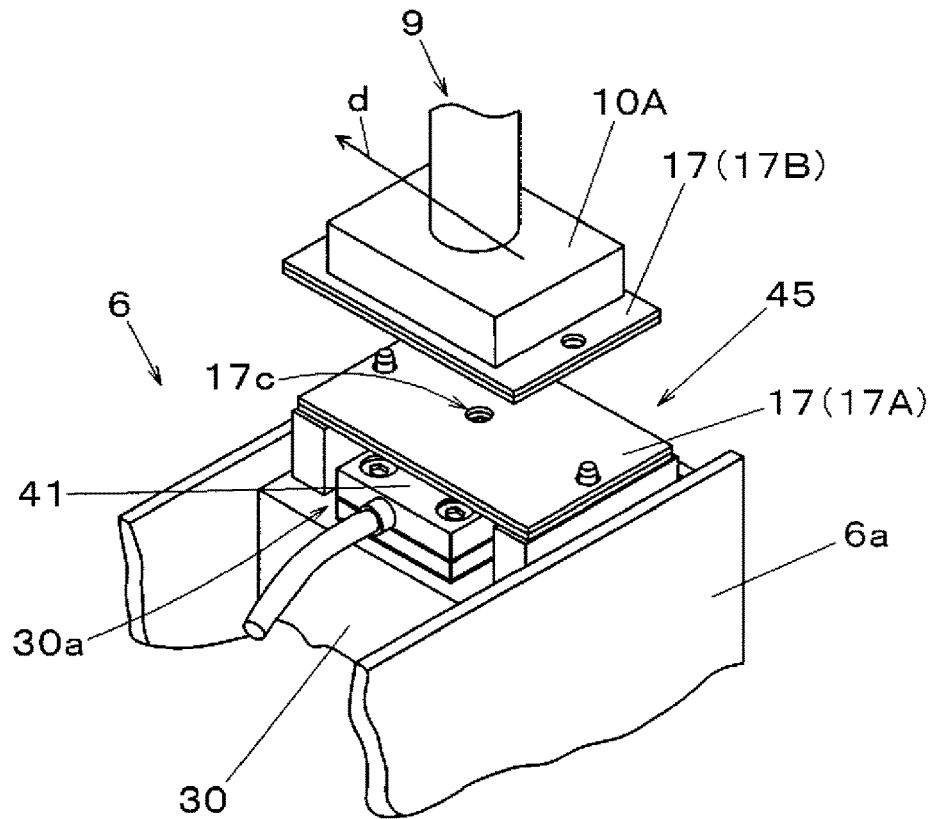
FIG. 9A is an operation explanatory view when the temporary use member is used as a measurement member in the electronic component mounting device according to the exemplary embodiment of the present disclosure.

Next, a trial coating operation performed by using temporary use member 17 as measurement member 17B is described with reference to FIG. 9A and FIG. 9B. In this exemplary embodiment, trial coating for coating paste P to measurement member 17B is performed in accordance with preliminarily set trial coating performing conditions. Such trial coating performing conditions include a case where either a coating amount or a coating position of paste P coated to electronic component 21 does not fall within a predetermined range or neither one of these factors fall within the predetermined range, a case where paste P is newly set in dispenser 6, and a case where a predetermined interval time or more elapses from timing that coating of paste P is finally performed. Control processing of such trial coating is performed in accordance with trial coating 53a among control processing functions which dispenser maintenance processing part 53 of control part 50 (see FIG. 11) possesses.

In this exemplary embodiment, the trial coating is performed by dispenser 6 in a state where temporary use member 17 which forms shield member 17A is held above ejection head part 30a of dispenser 6 by shield member mounting part 45. That is, as shown in FIG. 9A, mounting head 9 which holds by suction temporary use member 17 which forms measurement member 17B by member holding nozzle 10A is moved to a position above shield member 17A held by dispenser 6. Then, mounting head 9 is moved (arrow d) such that trial coating points set on temporary use member 17 sequentially pass just above opening portion 17c, that is, just above ejection hole 42 which ejects paste P in dispenser 6.

Figure 9B:
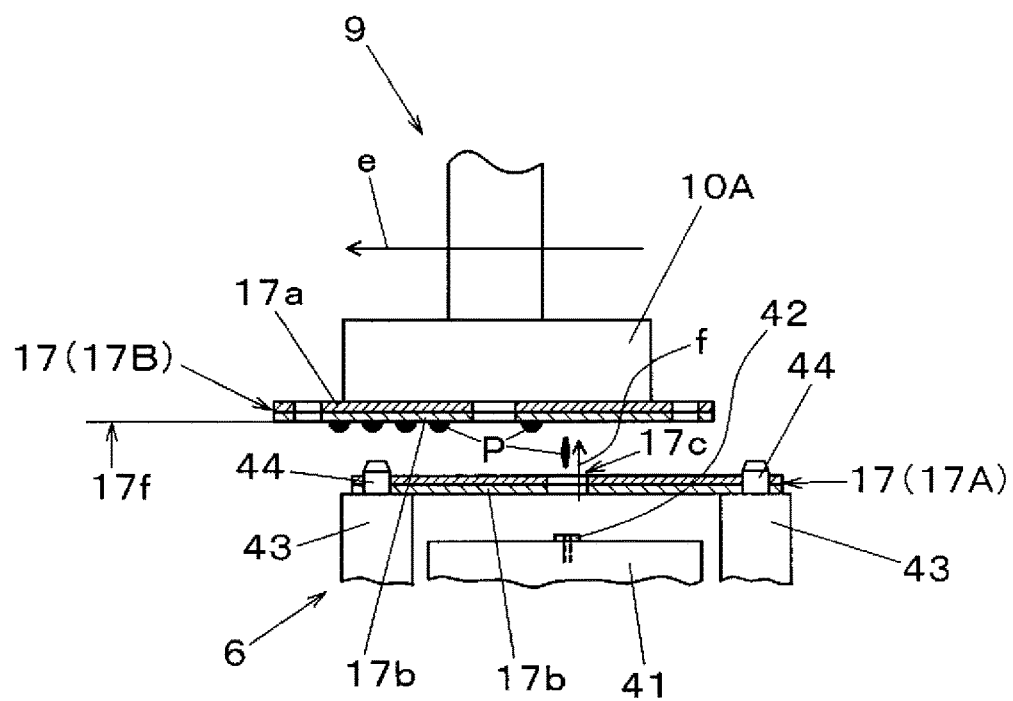
FIG. 9B is an operation explanatory view when the temporary use member is used as the measurement member in the electronic component mounting device according to the exemplary embodiment of the present disclosure.

As shown in FIG. 9B, during the movement of mounting head 9, paste P flies upward from upwardly opening ejection hole 42 against gravity through opening portion 17c (arrow f). Then, paste P is sequentially coated to the plurality of trial coating points set on lower surface 17f of temporary use member 17 which forms measurement member 17B moving above shield member 17A in a direction indicated by arrow e. Next, mounting head 9 which holds measurement member 17B to which the trial coating is already applied is moved to a position above component recognition camera 13, and measurement member 17B to which paste P is coated is imaged by component recognition camera 13. Then, a coating amount of paste P is measured by performing recognition processing of a result of imaging in accordance with a function which coating amount measurement 53c of dispenser maintenance processing part 53 possesses.

Next, a wiping operation performed by using temporary use member 17 as cleaning member 17C is described with reference to FIG. 10A and FIG. 10B. This wiping operation is performed when a defect attributed to instability of ejection of paste from ejection mechanism 30 such as irregularities in a coating amount or a coating position is detected as a result of recognition of a coating state of paste P coated to electronic component 21 or measurement member 17B by image recognition 52a. This wiping is performed in accordance with a control processing function of wiping 53b among functions which dispenser maintenance processing part 53 of control part 50 (see FIG. 11) possesses.

Figure 10A:
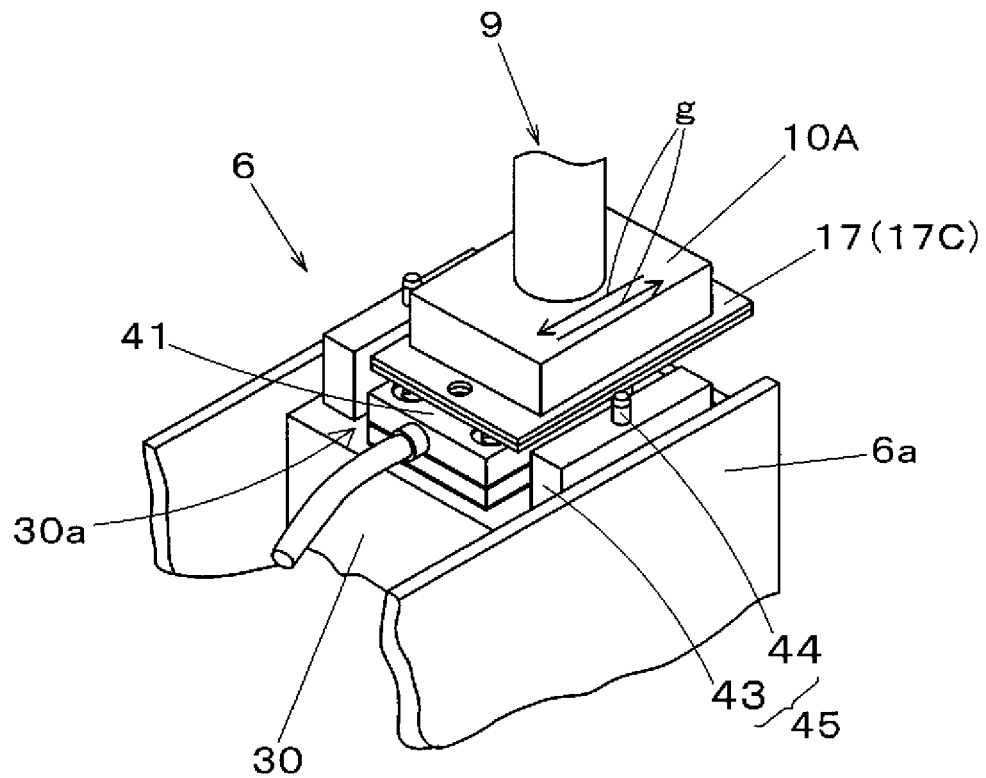
FIG. 10A is an operation explanatory view when the temporary use member is used as a cleaning member in the electronic component mounting device according to the exemplary embodiment of the present disclosure.
Figure 10B:
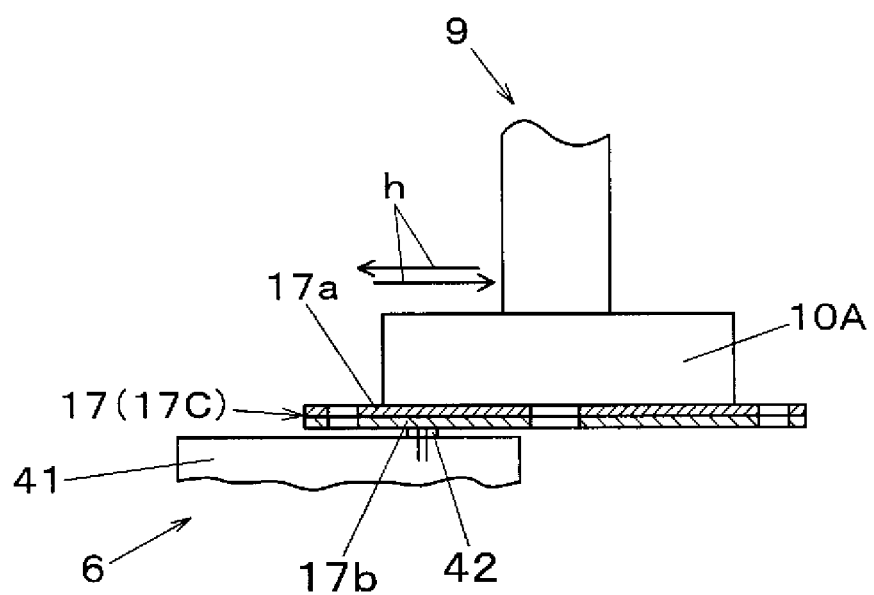
FIG. 10B is an operation explanatory view when the temporary use member is used as the cleaning member in the electronic component mounting device according to the exemplary embodiment of the present disclosure.

As shown in FIG. 10A, this wiping is performed in a state where an upper surface of ejection nozzle 41 is exposed by removing shield member 17A from shield member mounting part 45 which is mounted on ejection head part 30a of dispenser 6. That is, mounting head 9 on which member holding nozzle 10A is mounted is moved to temporary use member supply part 16 (see FIG. 1, FIG. 4A, and FIG. 4B), and temporary use member 17 which forms cleaning member 17c is held by member holding nozzle 10A.

Then, mounting head 9 where cleaning member 17C is held by member holding nozzle 10A is moved to a position above ejection nozzle 41 of dispenser 6, and mounting head 9 is moved in a reciprocating manner in a horizontal direction (arrow g) in a state where a lower surface of cleaning member 17C is brought into contact with ejection hole 42. With such an operation, as shown in FIG. 10B, second layer 17b of temporary use member 17 used as cleaning member 17C is brought into contact with an upper surface of ejection hole 42, and a smear material such as paste P adhering to the upper surface of ejection hole 42 is wiped off by second layer 17b due to reciprocating movement (arrow h) of mounting head 9. The operation of mounting head 9 in such wiping may be an operation which is obtained by suitably combining various types of operations such as reciprocating movements in two directions or a rotational operation besides reciprocating movement in one direction shown in FIG. 10A and FIG. 10B.

Figure 11:
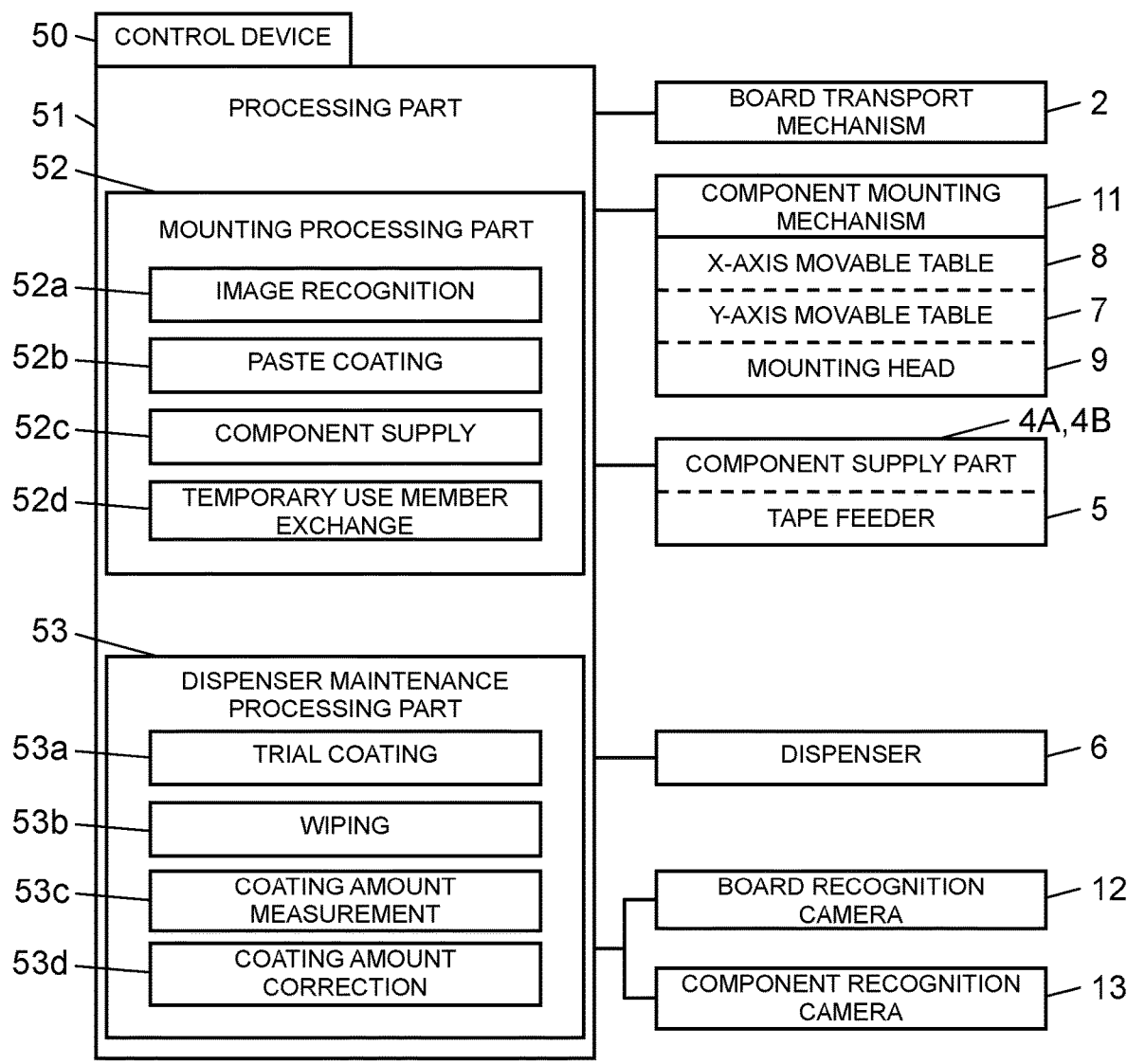
FIG. 11 is a block diagram showing a configuration of a control system of the electronic component mounting device according to the exemplary embodiment of the present disclosure.

Next, a configuration of a control system of electronic component mounting device 1 is described with reference to FIG. 11. In FIG. 11, control device 50 which performs operation control of electronic component mounting device 1 is connected to board transport mechanism 2, Y-axis movable table 7, X-axis movable table 8, component mounting mechanism 11 formed of mounting heads 9, tape feeders 5 disposed in component supply parts 4A, 4B, dispensers 6, board recognition cameras 12, and component recognition cameras 13.

Processing part 51 which is a control processing function which control device 50 possesses includes mounting processing part 52 and dispenser maintenance processing part 53. Mounting processing part 52 is a control processing function which performs operation processing for mounting electronic component 21 on board 3 through transferring and mounting operations by controlling the previously mentioned respective parts including board transport mechanism 2 in electronic component mounting device 1. That is, mounting processing part 52 includes control programs for performing respective processing of image recognition 52a, paste coating 52b, component supply 52c, and temporary use member exchange 52d. Further, dispenser maintenance processing part 53 is a control processing function for performing predetermined processing such as maintenance required by dispenser 6. That is, dispenser maintenance processing part 53 includes control programs for performing respective processing of trial coating 53a, wiping 53b, coating amount measurement 53c, and coating amount correction 53d.

Image recognition 52a is control processing for applying recognition processing to a result of imaging obtained by board recognition camera 12 and component recognition camera 13. Paste coating 51b is control processing for coating a lower surface of electronic component 21 by ejecting paste P from dispenser 6. Component supply 52c is control processing for supplying electronic component 21 to component mounting mechanism 11 by tape feeders 5. Temporary use member exchange 52d is control processing for performing processing where temporary use members 17 which are mounted on dispenser 6 and are used in a state that temporary use members 17 are held by mounting head 9 as shield member 17A, measurement member 17B, and cleaning member 17C are exchanged. With such processing, by using mounting head 9, unused temporary use member 17 is picked up from temporary use member supply part 16, and used temporary use member 17 is discarded and is recovered in disposal box 15.

Trial coating 53a is control processing for performing processing where temporary use member 17 is held by mounting head 9 as measurement member 17B and is moved to a position above dispenser 6, and paste P ejected from ejection hole 42 is coated to measurement member 17B as the trial coating. Wiping 53b is control processing for performing processing where temporary use member 17 is held by mounting head 9 as cleaning member 17C and moved to dispenser 6 so as to wipe off paste P adhering to ejection hole 42 and a periphery of ejection hole 42 by first layer 17a of cleaning member 17C.

Coating amount measurement 53c is control processing for performing processing where measurement member 17B to which paste P is coated by the trial coating in accordance with trial coating 53a, that is, temporary use member 17 which receives paste P experimentally being caused to fly out from dispenser 6 is imaged by component recognition camera 13, and recognition processing is applied to an imaging result obtained by such imaging so that a coating amount of paste P coated to temporary use member 17 is measured. Coating amount correction 53d is control processing for regulating a coating amount in a single shot of paste P by ejection mechanism 30 of dispenser 6 based on a result of measurement of the coating amount of paste P acquired by coating amount measurement 53c. In this exemplary embodiment, the coating amount is regulated by regulating a parameter relating to a coating amount of paste in a single shot (for example, air pressure for pressuring syringe 32, a valve open time at the time of pressurization, or the like).

In the above-mentioned control processing functions, respective processing consisting of temporary use member exchange 52d of mounting processing part 52, trial coating 53a and wiping 53b of dispenser maintenance processing part 53 correspond to control processing for making the previously-mentioned dispenser processing operation part which electronic component mounting device 1 includes perform the respective predetermined processing.

Figure 12:
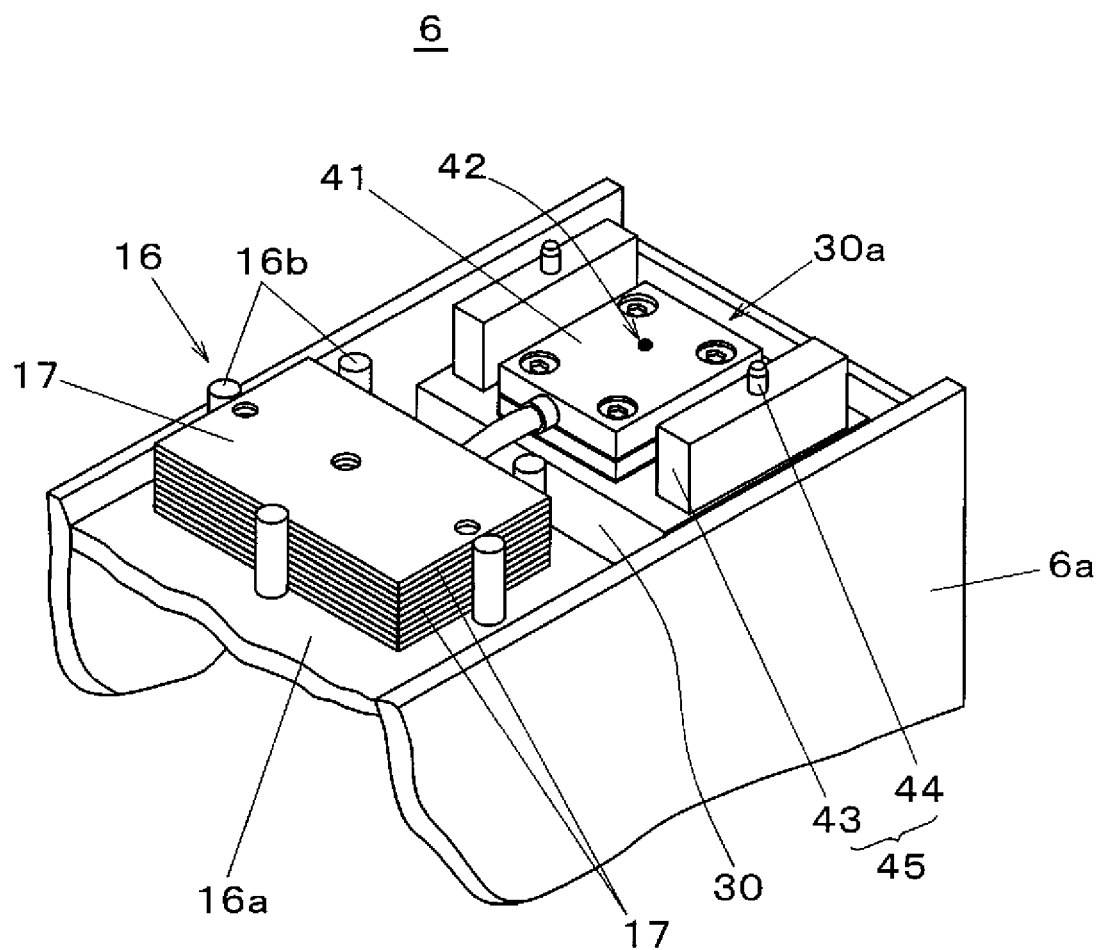
FIG. 12 is an explanatory view of the temporary use member supply part disposed in the dispenser of the electronic component mounting device according to the exemplary embodiment of the present disclosure.

In the configuration shown in FIG. 1, an example is shown where temporary use member supply part 16 which supplies temporary use member 17 is disposed between board transport mechanism 2 and component supply part 4A. However, as shown in FIG. 12, the configuration may be adopted where dispenser 6 includes temporary use member supply part 16 which supplies temporary use member 17 which forms unused shield member 17A. That is, in this example, temporary use member supply part 16 having substantially the same configuration shown in FIG. 4B may be disposed on an upper surface of body portion 6a at a position disposed adjacently to ejection mechanism 30 disposed at a distal end portion of body portion 6a. With such a configuration, a space necessary for disposing temporary use member supply part 16 can be eliminated and, at the same time, it is possible to make a plurality of temporary use members 17 stand-by in a stacked manner adjacent to a position where shield member 17A is used. Accordingly, it is possible to acquire an advantageous effect that an exchange of shield member 17A can be efficiently performed.

CONCLUSION

Electronic component mounting device 1 according to the present disclosure includes: mounting head 9 which picks up electronic component 21 from the part feeder (tape feeder 5), and transfers and mounts electronic component 21 on board 3; dispenser 6 which coats paste P being caused to fly out from upwardly opening ejection hole 42 against gravity to a lower surface of electronic component 21 picked up by mounting head 9; and shield member 17A which is disposed between electronic component 21 and dispenser 6 and has a portion opening above ejection hole 42.

It is more preferable that dispenser 6 have shield member mounting part 45 which holds shield member 17A, and shield member mounting part 45 hold shield member 17A at a position upwardly away from ejection hole 42.

It is preferable that shield member 17A be detachably mounted on shield member mounting part 45.

It is more preferable that electronic component mounting device 1 according to the present disclosure have mounting head 9 which functions as a shield member exchanging part. The shield member exchanging part (mounting head 9) removes shield member 17A to which paste P adheres from shield member mounting part 45, and mounts unused shield member 17A on shield member mounting part 45. The shield member exchanging part has: the recovery part (disposal box 15) which recovers used shield member 17A (used temporary use member 17) removed from shield member mounting part 45; the shield member supply part (temporary use member supply part 16) which supplies unused shield member 17A (unused temporary use member 17) to electronic component mounting device 1; and the shield member transferring part which transfers used shield member 17A (used temporary use member 17) and unused shield member 17A (unused temporary use member 17) (the shield member transferring part being configured to include the shield member holding part having a function of holding shield member 17A on mounting head 9).

Shield member 17A has a plate-shape. The shield member supply part (temporary use member supply part 16) stacks shield members 17A, and supplies shield members 17A to electronic component mounting device 1.

In electronic component mounting device 1 of the present disclosure, the shield member holding part (for example, component suction nozzle 10) which can hold one of the plurality of shield members 17A is mounted on mounting head 9, and mounting head 9 forms a part of the shield member transferring part.

Electronic component mounting device 1 according to the present disclosure includes: mounting head 9 which picks up electronic component 21 from the part feeder (tape feeder 5), and transfers and mounts electronic component 21 on board 3; feeder base 18a which has the slot in which the part feeder (tape feeder 5) is mounted; the part feeder (tape feeder 5) which is mounted in the slot of feeder base 18a; and dispenser 6 which coats paste P being caused to fly out from upwardly opening ejection hole 42 against gravity to the lower surface of electronic component 21 picked up by mounting head 9. Dispenser 6 has shield member 17A where a portion of shield member 17A which corresponds to ejection hole 42 is opened in a limited manner at a position upwardly away from ejection hole 42.

It is preferable that dispenser 6 include shield member mounting part 45 for holding shield member 17A, and shield member 17A be detachably mounted on shield member mounting part 45.

It is more preferable that electronic component mounting device 1 according to the present disclosure have mounting head 9 which functions as the shield member exchanging part. The shield member exchanging part (mounting head 9) removes shield member 17A to which paste P adheres from shield member mounting part 45, and mounts unused shield member 17A (unused temporary use member 17) on shield member mounting part 45.

The shield member exchanging part has: the recovery part (disposal box 15) which recovers shield member 17A (used temporary use member 17) removed from shield member mounting part 45; the shield member supply part which supplies unused shield member 17A (unused temporary use member 17) to electronic component mounting device 1; and the shield member transferring part which transfers used shield member 17A and unused shield member 17A (the shield member transferring part being configured to include the shield member holding part having a function of holding shield member 17A on mounting head 9).

Dispenser 6 according to the present disclosure is dispenser 6 which is mounted on electronic component mounting device 1 where mounting head 9 picks up electronic component 21 from the part feeder (tape feeder 5) mounted in the slot of feeder base 18a, and transfers and mounts electronic component 21 on board 3, wherein dispenser 6 includes: body portion 6a which is mountable in the slot; ejection hole 42 which causes paste P to fly upward toward the lower surface of electronic component 21 picked up by mounting head 9; and shield member 17A which has a portion opening above ejection hole 42 at a position upwardly away from ejection hole 42.

As has been described above, electronic component mounting device 1 of this exemplary embodiment is electronic component mounting device 1 where mounting head 9 picks up electronic component 21 from tape feeder 5 which forms the part feeder, and transfers and mounts electronic component 21 on board 3. Electronic component mounting device 1 further includes dispenser 6 which coats paste P being caused to fly out from upwardly opened ejection hole 42 against gravity to the lower surface of electronic component 21 picked up by mounting head 9. Electronic component mounting device 1 still further includes: temporary use member supply part 16 which stacks plate-like or sheet-like temporary use members 17 and supplies temporary use members 17; and the dispenser processing operation part which performs predetermined processing on dispenser 6 using temporary use member 17 supplied from temporary use member supply part 16.

As processing performed by the dispenser processing operation part, temporary use member 17 disposed above dispenser 6 and between dispenser 6 and electronic component 21 by mounting head 9 is used in an exchanging manner as shield member 17A having a portion opening above ejection hole 42 of dispenser 6 and used for the purpose of reducing scattering of paste P being caused to fly out by dispenser 6. Accordingly, it is possible to prevent paste P from adhering to positions other than the desired position of electronic component 21 where the adhesion of paste P is desirable and positions where adhesion of paste P is not desirable such as mounting head 9. Accordingly, a drawback such as a conduction failure attributed to the adhesion of paste P or the like can be prevented thus reducing the occurrence of a defective product.

As processing performed by dispenser processing operation part, temporary use member 17 held by mounting head 9 is used as measurement member 17B which receives paste P experimentally being caused to fly out from dispenser 6. With such a configuration, it is possible to eliminate a drawback which occurs in a prior art in a case where an actual electronic component is used in the trial coating, that is, it is possible to eliminate a wasteful use of an electronic component which is discarded after use.

As processing performed by dispenser processing operation part, temporary use member 17 held by mounting head 9 is used as cleaning member 17C which wipes off paste P adhering to ejection hole 42 of dispenser 6 or a periphery of ejection hole 42. Accordingly, an operation of wiping off adhered paste P by smearing can be automatically performed. With such a configuration, a burden of an operator in a maintenance operation such as cleaning can be reduced and hence, a maintenance and cleaning operation can be performed efficiently and properly.

INDUSTRIAL APPLICABILITY

An electronic component mounting device and a dispenser according to the present disclosure have advantageous effects that, in coating a paste to a lower surface of an electronic component, the occurrence of defective products can be reduced and, at the same time, a burden of an operator in a maintenance operation such as cleaning can be reduced. Accordingly, the electronic component mounting device and the dispenser according to the present disclosure are useful in a component mounting field where a paste is coated to an electronic component and the electronic component is transferred and mounted on a board.

REFERENCE MARKS IN THE DRAWINGS

1: electronic component mounting device
1a: base
1b: fixed base
3: board
4A, 4B: component supply part
5: tape feeder
6: dispenser
6a: body portion
7: axis movable table
8: axis movable table
9: mounting head
10: component suction nozzle
10A: member holding nozzle
11: component mounting mechanism
12: board recognition camera
13: component recognition camera
14: nozzle holder
15: disposal box
16: temporary use member supply part
16a: pedestal
16b: position holding post
17: temporary use member
17A: shield member
17B: measurement member
17C: cleaning member
17a, 17b: layer
17c: opening portion
17d, 17e: hole
17f: lower surface
18: carriage
18a: feeder base
19: supply reel
20: carrier tape
21: electronic component
30: ejection mechanism
30a: ejection head part
31: ejection pipe
32: syringe
32a: float member
32b: residual amount detection sensor
33: pressurizing pipe
34: valve unit
35: regulator
36: air supply source
37: controller
38: operation panel
41: ejection nozzle
42: ejection hole
43: holding block
44: positioning pin
45: shield member mounting part
50: control device
51: processing part
52: mounting processing part
52a: image recognition
52b: paste coating
52c: component supply
52d: temporary use member exchange
53: dispenser maintenance processing part
53a: coating
53c: coating amount measurement
53d: coating amount correction
P: paste

The invention claimed is:

1. An electronic component mounting device comprising:
a mounting head which picks up an electronic component from a part feeder, and transfers and mounts the electronic component on a board;
a dispenser which applies a paste to a lower surface of the electronic component picked up by the mounting head, the paste being flied out from an ejection hole of the dispenser against gravity, the ejection hole opening upwardly; and
a shield member which is disposed between the electronic component and the dispenser and has an opening at a position upwardly away from the ejection hole.

2. The electronic component mounting device according to claim 1, wherein
the dispenser has a shield member mounting part which holds the shield member, and
the shield member mounting part holds the shield member at the position upwardly away from the ejection hole.

3. The electronic component mounting device according to claim 2, wherein
the shield member is detachably mounted on the shield member mounting part.

4. The electronic component mounting device according to claim 3, further comprising a shield member exchanging part, wherein
the shield member exchanging part removes the shield member to which a paste adheres from the shield member mounting part, and mounts an unused shield member on the shield member mounting part.

5. The electronic component mounting device according to claim 4, wherein
the shield member exchanging part has:
a recovery part which recovers the shield member removed from the shield member mounting part;
a shield member supply part which supplies the unused shield member to the electronic component mounting device; and
a shield member transferring part which transfers the shield member and the unused shield member.

6. The electronic component mounting device according to claim 5, wherein
the unused shield member is one of a plurality of shield members,
the plurality of shield members each have a plate-shape, and
the shield member supply part stacks the plurality of shield members and supplies the plurality of shield members to the electronic component mounting device.

7. The electronic component mounting device according to claim 5, wherein
a shield member holding part capable of holding the shield member is mounted on the mounting head, and
the mounting head is a part of the shield member transferring part.

8. An electronic component mounting device comprising:
a mounting head which picks up an electronic component from a part feeder, and transfers and mounts the electronic component on a board;
a feeder base which has a slot in which the part feeder is mounted;
the part feeder which is mounted in the slot of the feeder base; and a dispenser which applies a paste to a lower surface of the electronic component picked up by the mounting head, the paste being flied out from an ejection hole of the dispenser against gravity, the ejection hole opening upwardly, wherein the dispenser has a shield member where a portion of the shield member which corresponds to the ejection hole is opened in a limited manner at a position upwardly away from the ejection hole.

9. The electronic component mounting device according to claim 8, wherein the dispenser has a shield member mounting part which holds the shield member, and the shield member is detachably mounted on the shield member mounting part.

10. The electronic component mounting device according to claim 9, further comprising a shield member exchanging part, wherein the shield member exchanging part removes the shield member to which the paste adheres from the shield member mounting part, and mounts an unused shield member on the shield member mounting part.

11. The electronic component mounting device according to claim 10, wherein the shield member exchanging part has:

a recovery part which recovers the shield member removed from the shield member mounting part;

a shield member supply part which supplies the unused shield member to the electronic component mounting device; and a shield member transferring part which transfers the shield member and the unused shield member.

12. The electronic component mounting device according to claim 11, wherein the unused shield member is one of a plurality of shield members, the plurality of shield members each have a plate-shape, and the shield member supply part stacks the plurality of shield members and supplies the plurality of shield members to the electronic component mounting device.

13. The electronic component mounting device according to claim 11, wherein the shield member supply part is mounted on the dispenser.

14. The electronic component mounting device according to claim 11, wherein the mounting head forms a part of the shield member transferring part.

15. A dispenser which is mounted on an electronic component mounting device where a mounting head picks up an electronic component from a part feeder mounted in a slot of a feeder base, and transfers and mounts the electronic component on a board, the dispenser comprising:

a body portion which is mountable in the slot;

an ejection hole which causes a paste to fly upward toward a lower surface of the electronic component picked up by the mounting head; and a shield member which has a portion opening above the ejection hole at a position upwardly away from the ejection hole.

16. The dispenser according to claim 15, further comprising a shield member mounting part for holding the shield member, wherein the shield member is detachably mounted on the shield member mounting part.

17. The dispenser according to claim 16, further comprising a shield member supply part for supplying an unused shield member.

18. The electronic component mounting device according to claim 1, wherein the shield member can be freely attached or detached from the dispenser.

* * * * *